(12) United States Patent
Gotanda

(10) Patent No.: US 11,410,818 B2
(45) Date of Patent: Aug. 9, 2022

(54) SEMICONDUCTOR ELEMENTS AND METHOD FOR MANUFACTURING THE SAME

(71) Applicant: KABUSHIKI KAISHA TOSHIBA, Minato-ku (JP)

(72) Inventor: Takeshi Gotanda, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/919,862

(22) Filed: Mar. 13, 2018

(65) Prior Publication Data

US 2019/0051464 A1    Feb. 14, 2019

(30) Foreign Application Priority Data

Aug. 10, 2017 (JP) .............................. JP2017-155876

(51) Int. Cl.
*H01G 9/20* (2006.01)
*H01L 51/44* (2006.01)
(Continued)

(52) U.S. Cl.
CPC ........... *H01G 9/2059* (2013.01); *H01G 9/204* (2013.01); *H01G 9/2031* (2013.01);
(Continued)

(58) Field of Classification Search
CPC .............. H01L 51/00; H01L 2251/305; H01L 51/4253; H01L 51/442; H01L 51/5032; H01L 51/5218; H01L 51/0021; H01L 51/0077; H01L 51/5234; H01L 31/1884; H01G 9/2059; H01G 9/2031; H01G 9/204
(Continued)

(56) References Cited

U.S. PATENT DOCUMENTS

2002/0015881 A1* 2/2002 Nakamura ........... H01G 9/2031
  429/111
2003/0178630 A1* 9/2003 Maruyama ...... H01L 31/022475
  257/98
(Continued)

FOREIGN PATENT DOCUMENTS

CN   105609643 A   5/2016
JP   2011-34989 A  2/2011
(Continued)

OTHER PUBLICATIONS

Gwamuri, (Influence of Oxygen Concentration on the Performance of Ultra-Thin RF Magnetron Sputter Deposited Indium Tin Oxide Films as a Top Electrode for Photovoltaic Devices).*
(Continued)

*Primary Examiner* — Andrew J Golden
(74) *Attorney, Agent, or Firm* — Oblon, McClelland, Maier & Neustadt, L.L.P.

(57) ABSTRACT

The present embodiments provide a semiconductor element comprising
  a first electrode,
  an active layer,
  a second electrode comprising a homogeneous metal layer, and further
  a barrier layer comprising a transparent metal oxide. The barrier layer is placed between the active layer and the second electrode. The present embodiments also provide a method for manufacturing said semiconductor element.

4 Claims, 9 Drawing Sheets

(51) Int. Cl.
H01L 51/42 (2006.01)
H01L 51/00 (2006.01)
H01L 31/18 (2006.01)
H01L 51/52 (2006.01)
H01L 51/50 (2006.01)

(52) U.S. Cl.
CPC ........ *H01L 51/4253* (2013.01); *H01L 51/442* (2013.01); *H01L 51/5032* (2013.01); *H01L 51/5092* (2013.01); *H01L 51/5218* (2013.01); *H01L 31/1884* (2013.01); *H01L 51/0021* (2013.01); *H01L 51/0077* (2013.01); *H01L 51/4246* (2013.01); *H01L 51/5004* (2013.01); *H01L 51/5234* (2013.01); *H01L 2251/305* (2013.01); *H01L 2251/308* (2013.01)

(58) Field of Classification Search
USPC ................................................ 136/243–265
See application file for complete search history.

(56) References Cited

U.S. PATENT DOCUMENTS

| | | | |
|---|---|---|---|
| 2005/0121068 A1* | 6/2005 | Sager ................. | H01L 51/4213 136/252 |
| 2005/0183769 A1* | 8/2005 | Nakagawa ........... | H01G 9/2031 136/263 |
| 2006/0065298 A1* | 3/2006 | Nakashima ..... | H01L 31/022425 136/256 |
| 2011/0056550 A1* | 3/2011 | Choi ................. | H01L 31/02167 136/256 |
| 2011/0088763 A1* | 4/2011 | Le ....................... | H01L 31/1804 136/255 |
| 2015/0122314 A1* | 5/2015 | Snaith ................. | H01L 51/4213 136/255 |
| 2016/0351808 A1 | 12/2016 | Luchinger et al. | |

FOREIGN PATENT DOCUMENTS

| | | |
|---|---|---|
| JP | 2013-168672 A | 8/2013 |
| JP | 2014-73598 A | 4/2014 |
| JP | 2016-224386 A | 12/2016 |
| KR | 10-2013-0070697 A | 6/2013 |
| KR | 10-2015-0071553 A | 6/2015 |
| KR | 10-2017-0002967 A | 1/2017 |
| WO | WO 2016/128133 A1 | 8/2016 |
| WO | WO 2016/144883 A1 | 9/2016 |
| WO | WO 2017/111030 A1 | 6/2017 |

OTHER PUBLICATIONS

Pemsler, (Studies on the oxygen Gradient in oxidizing metals), Journal of The Electrochemical Society, Apr. 1964.*

Xingtian Yin et al., "Solution-induced Morphology Change of Organic-Inorganic Hybrid Perovskite Films for High Efficiency Inverted Planar Heterojunction Solar Cells", Electrochimica Acta, vol. 191, 2016, pp. 750-757.

Md. Bodiul Islam et al., "NiOx Hole Transport Layer for Perovskite Solar Cells with Improved Stability and Reproducibility", ACS Omega, vol. 2, May 24, 2017, pp. 2291-2299.

Wei-Chih Lai et al., "Conversion efficiency improvement of inverted $CH_3NH_3PbI_3$ perovskite solar cells with room temperature sputtered ZnO by adding the $C_{60}$ interlayer", Applied Physics Letters, 2015, vol. 107, pp. 253301-1 to 253301-5.

Anand S. Subbiah et al., "Stable p-i-n $FAPbBr_3$ Devices with Improved Efficiency Using Sputtered ZnO as Electron Transport Layer", Advanced Materials Interfaces, Feb. 10, 2017, vol. 4, pp. 1601143-1 to 1601143-7.

* cited by examiner

US 11,410,818 B2

SEMICONDUCTOR ELEMENTS AND METHOD FOR MANUFACTURING THE SAME

CROSS-REFERENCE TO RELATED APPLICATIONS

This application is based upon and claims the benefit of priority from the prior Japanese Patent Application No. 2017-155876, filed on Aug. 10, 2017, the entire contents of which are incorporated herein by reference.

FIELD

The present disclosure relates to highly efficient and durable large-area semiconductor elements and manufacture thereof.

BACKGROUND

Semiconductor elements, such as photoelectric conversion devices and light-emitting devices, have been hitherto generally manufactured according to relatively complicated methods, such as, a vapor-deposition process. If it becomes possible to produce the semiconductor elements by coating or printing, they can be obtained more easily and inexpensively than ever before and hence many researches are in progress to develop such methods. Meanwhile, vigorous studies are also under way to develop semiconductor elements, such as, solar cells, sensors and light-emitting devices, made of organic materials or composite materials of organic and inorganic components. Those studies are aimed to develop elements having high efficiency in photoelectric conversion or in luminescence. As a target of those studies, perovskite semiconductor is now gathering attention because it can be produced by a coating process and can be expected to have high efficiency.

BRIEF DESCRIPTION OF THE DRAWINGS

FIGS. 6A, 6B and 6C are IV characteristic diagrams when light is applied from the first electrode side, then from the second electrode side, and again from the first electrode side, respectively.

DETAILED DESCRIPTION

Embodiments will now be explained with reference to the accompanying drawings.

The semiconductor element according to an embodiment comprises
a first electrode,
an active layer, and
a second electrode comprising a homogeneous metal layer; wherein
a barrier layer comprising a transparent metal oxide is further provided between said active layer and said second electrode.

Further, the method according to another embodiment for manufacturing a semiconductor element comprising
a first electrode,
an active layer,
a second electrode comprising a homogeneous metal layer, and further
a barrier layer which comprises a transparent metal oxide and which is provided between said active layer and said second electrode; wherein
said method comprising a process to form said barrier layer selected from the group consisting of sputtering, vacuum deposition, physical vapor deposition (PVD), chemical vapor deposition (CVD), wet-coating, spin-coating, and spray-coating.

In the present disclosure, the "semiconductor element" includes not only a photoelectric conversion device, such as a solar cell or a sensor, but also a light-emitting device. Those devices have the same basic structures although they are different in that the active layer functions as a photoelectric conversion layer or as a light-emitting layer.

In order to explain component members of the semiconductor element according to the embodiment, those of the element serving as a solar cell are exemplified and described below. However, the following explanation can be also applied to the component members of other photoelectric conversion devices having the same structures.

Figure 1:
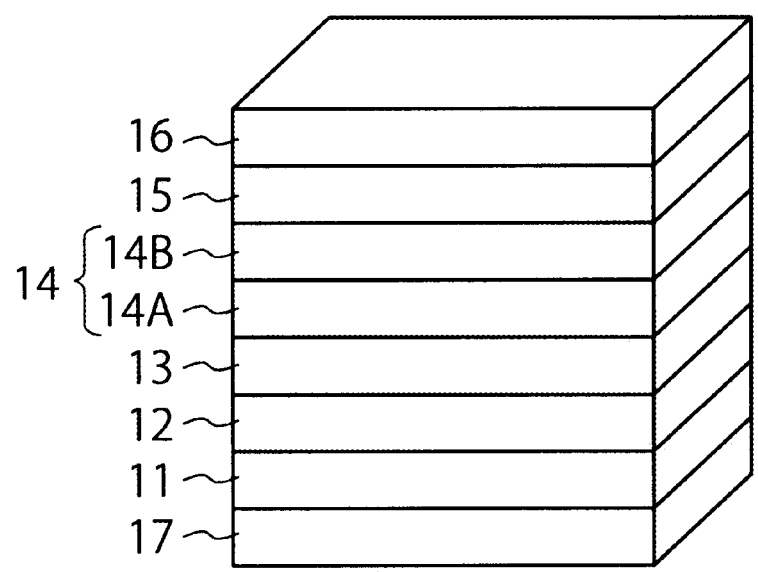
FIG. 1 schematically shows a structure of the semiconductor element manufactured according to the embodiment.

FIG. 1 schematically shows an example of the structure of a solar cell 10, which is a practical form of the semiconductor element according to the embodiment. The solar cell comprises a substrate 17, a first electrode 11, a first buffer layer 12, an active layer (photoelectric conversion layer) 13, a second buffer layer 14, a barrier layer 15 and a second electrode 16, stacked in order.

The first or second electrode 11 or 16 serves as an anode or a cathode to feed electricity. The active layer 13 generates electrons or positive holes in the first or second electrode 11 or 16 when excited by incident light coming through the substrate 17, the first electrode 11 and the first buffer layer 12 or through the second electrode 16 and the second buffer layer 14. Further, the active layer 13 generates light when electrons and positive holes are injected thereinto from the first and second electrodes 11 and 16.

In FIG. 1, the first and second buffer layers 12 and 14 are positioned between the active layer and the first electrode and between the active layer and the second electrode, respectively. The first and second buffer layers in FIG. 1 are placed on both surfaces of the active layer. However, the element may have what is called a "back-contact structure", in which a set of the first electrode 11 and the first buffer layer 12 and another set of the second buffer layer 14 and the second electrode 16 are placed with a gap between them but on the same side of the active layer 13.

The second buffer layer may have a layered structure comprising two or more layers. FIG. 1 shows a second buffer layer consisting of two sublayers 14A and 14B. For example, the active layer-side buffer sublayer 14A may contain an organic semiconductor, and the second electrode-side sublayer 14B may contain a metal oxide.

The active layer-side and second electrode-side sublayers 14A and 14B are made of materials capable of transferring electrons and positive holes. The second electrode-side sublayer 14B has a function of protecting the active layer 13, the first buffer layer 12 and the active layer-side buffer sublayer 14A from damages when the barrier layer 15 is formed.

The barrier layer 15 has a function of preventing the second electrode from deterioration (the details are described later). In order to fully fulfill the function, the barrier layer 15 is preferably denser than the second electrode-side sublayer 14B.

The layers constituting the semiconductor element according to the embodiment are individually described below.

(Substrate 17)

The substrate 17 supports other component members, at least, in a production process. This means that the substrate may be used in some steps of the production process of the solar cell and then removed in the subsequent step or after the production process. The substrate 17 preferably has a surface on which electrodes can be formed, and accordingly is preferably hardly impaired by heat applied thereto or by organic solvents brought in contact therewith when the electrodes are formed thereon. Examples of materials of the substrate 17 include: (i) inorganic substances, such as, non-alkali glass and quartz glass; (ii) organic substances, such as, polyethylene, polyethylene terephthalate (PET), polyethylene naphthalate (PEN), polyimide, polyamide, polyamide-imide, liquid crystal polymer, plastics (e.g., cycloolefin polymers), and polymer films; and (iii) metals, such as, stainless steel (SUS), aluminum, titanium and silicon.

The substrate 17 is made of materials properly selected according to the structure of the aimed solar cell. If the substrate is removed in or after the production process, it may be either transparent or not. If the photoelectric conversion device comprises the substrate 17 through which incident light comes, transparent materials are adopted. If placed on the side opposite to the light incident surface in the device, the substrate 17 does not need to be transparent.

There are no particular restrictions on the thickness of the substrate as long as it has enough strength to support other component members.

If the substrate 17 is placed on the light-incident side, it is possible to provide an antireflection film of, for example, moth-eye structure on the light-incident surface. That structure enables incident light to enter the device efficiently and thereby can improve the energy conversion efficiency of the cell. The moth-eye structure has a surface on which convexes of about 100 nm height are regularly arranged. Because of this convex structure, the refractive index continuously changes along the thickness direction. Accordingly, if the substrate is coated with that antireflective film, the film prevents the refractive index from discontinuous changing. As a result, the film reduces reflection of the incident light and thereby improves the conversion efficiency of the cell.

The substrate may be made of a single material, but may be a layered composition made of two or more materials. Further, it may be combined with another semiconductor element to have a function of photoelectric conversion. For example, the solar cell according to the embodiment may be placed on an existing silicon or compound solar cell to form a tandem solar cell. In that case, equivalent circuits of the cells preferably connect to each other in parallel. Further, the cells may share the same first electrode or the like. In that case, the equivalent circuits preferably connect to each other in series.

(First and Second Electrodes)

The first electrode 11 can be made of materials freely selected from known ones as long as they have electroconductivity. In the present embodiment, the first electrode is placed on the light-incident side, and accordingly the material of the first electrode should be selected from transparent or semitransparent electroconductive substances. Examples of the transparent or semitransparent electrode materials include electroconductive metal oxide films and semitransparent metal films. The first electrode 11 may have a layered structure of two or more materials.

Concrete examples of the films include: electroconductive glass films (e.g., NESA) comprising, for example, indium oxide, zinc oxide, tin oxide or a composite thereof, such as, indium-tin oxide (ITO), fluorine-doped tin oxide (FTO), or indium-zinc oxide; and films of metals, such as, gold, platinum, silver, and copper. Among them, films of metal oxides, such as ITO and FTO, are particularly preferably adopted as the first electrode. The transparent electrode made of the metal oxide can be formed by a generally known process. For example, it can be formed by a sputtering process under an atmosphere rich in a reactive gas, such as oxygen. The atmosphere in the process contains a reactive gas, such as oxygen, in an amount of 0.5% or more, so as to form a metal oxide film having high crystallinity and electroconductivity.

The electrode made of ITO preferably has a thickness of 30 to 300 nm. If the thickness is thinner than 30 nm, the electroconductivity tends to decrease and hence the resistance tends to increase. The increased resistance often lowers the photoelectric conversion efficiency. On the other hand, however, if the thickness is thicker than 300 nm, the ITO film tends to be less flexible. As a result, the thick film often suffers from cracks when stress is applied. The electrode preferably has as small a sheet resistance as possible. Specifically, the sheet resistance is preferably 10 Ω/square or less. The electrode may be a single layer, but it may consist of stacked plural sublayers made of materials having different work functions.

If formed adjacently to an electron transport layer, the first electrode is preferably made of materials having low work functions, such as, alkali metals and alkaline earth metals. Examples thereof include: Li, In, Al, Ca, Mg, Sm, Tb, Yb, Zr, Na, K, Rb, Cs, Ba, and alloys thereof. Further, metals selected from the above materials having low work functions may be alloyed to use with metals selected from those having relatively high work functions, such as, gold, silver, platinum, copper, manganese, titanium, cobalt, nickel, tungsten, and tin. Examples of the alloys usable for the electrode include: lithium-aluminum alloy, lithium-manganese alloy, lithium-indium alloy, manganese-silver alloy, calcium-indium alloy, manganese-aluminum alloy, indium-silver alloy, and calcium-aluminum alloy. The electrode made of those alloys preferably has a thickness of 1 to 500 nm, more preferably 10 to 300 nm. If the thickness is thinner than the above, the resistance often increases too much to transfer a sufficient amount of generated electric charges into the external circuit. On the other hand, if the electrode is too thick, it takes a long time to form the electrode. Accordingly, the electrode material is often exposed to high temperature in such a long time that it may be damaged to deteriorate the performance. In addition, the material is used in a large amount and the film-forming apparatus is operated for a long time, and consequently the production cost tends to increase.

It is also possible to adopt organic materials as the first electrode materials. For example, electroconductive polymer compounds, such as polyethylenedioxythiophene (hereinafter, often referred to as "PEDOT"), are preferably employed. Those electroconductive polymer compounds are commercially available, and examples thereof include Clevios PH500, Clevios PH, Clevios P VP Al 4083, and Clevios HIL 1,1 ([trademark], manufactured by H.C, Starck GmbH). PEDOT has a work function (or ionization potential) of 4.4 eV, but can be combined with other materials to control the work function of the electrode. For example, PEDOT is mixed with polyethylene sulfonate salt (hereinafter, often referred to as "PSS") to control the work function in a range of 5.0 to 5.8 eV. However, if electroconductive polymer compounds and other materials are combined to form a layer, the layer may contain the electroconductive polymer compounds in such a relatively small content that it may deteriorate in carrier transportability. In view of that, the electrode thus formed preferably has a thickness of 50 nm or less, more preferably 15 nm or less. Further, if the content of the electroconductive polymer compounds is relatively decreased, the electrode tends to repel the coating solution applied thereon to form the perovskite layer because the surface energy changes. Consequently, the resultant perovskite layer may suffer from pinholes formed thereon. In order to avoid them, nitrogen gas or the like is preferably blown onto the coating solution so that the solvent may be completely dried before the solution is repelled. As the electroconductive polymer compounds, polypyrrole, polythiophene and polyaniline are preferably employed.

In the embodiment, the second electrode comprises a homogeneous metal layer. Here, the "homogeneous" layer means that the layer does not have openings or the like for improving the light-transparency but has a continuous coating film structure. Accordingly, the embodiment includes neither a structure of metal thin film having plural penetrating holes, nor a fabric structure of metal fibers, nor a comb structure of thin metal wires.

The second metal electrode preferably has a thickness of 10 to 60 nm. When exposed to light, the second electrode having a thickness in the above range can transmit light to the second buffer layer and the active layer. On the other hand, when the first electrode is exposed to light, the incident light is not completely absorbed by the active layer and unabsorbed light reaches to the second electrode. Since comprising a homogeneous metal layer, the second electrode reflects all the unabsorbed light and thereby enables the active layer to absorb it again. In contrast, a metal film having plural penetrating holes reflects only a part of the unabsorbed light and hence cannot make the active layer absorb all the light again.

The material of the second electrode is selected from homogeneous films of aluminum, silver, gold, platinum, copper and the like. Among them, aluminum and silver are preferred, and particularly preferred is aluminum in view of cost and light-reflectivity.

(Active Layer)

The active layer (photoelectric conversion layer) 13 produced by the method according to the embodiment has at least partly a perovskite structure. Here, the "perovskite structure" means a kind of crystal structure and, specifically, the same crystal structure as perovskite. The perovskite structure typically comprises ions A, B and X where the ion B is smaller than the ion A. The chemical composition of this crystal structure can be represented, for example, by the following formula (1):

$$ABX_3 \quad (1).$$

In the formula, A may be a primary ammonium ion, such as, $CH_3NH_3^+$, $C_2H_5NH_3^+$, $C_3H_7NH_3^+$, $C_4H_9NH_3^+$ or $HC(NH_2)_2^+$, and is preferably $CH_3NH_3^+$. However. A is not limited to them. Further, A is also preferably Cs or 1,1,1-trifluoro-ethyl ammonium iodide (FEAT), but is not limited to them. The ion B is typically a divalent metal ion, and is preferably $Pb^{2-}$ or $Sn^{2-}$. However, B is not limited to them. The ion X is preferably a halogen ion, which is, for example, selected from $F^-$, $Cl^-$, $Br^-$, $I^-$ or $At^-$, and is preferably $Cl^-$, $Br^-$ or $I^-$. However. X is not limited to them. The materials of A, B and X may be individually single substances or mixtures. Even if not strictly satisfying the ratio of $ABX_3$, those ions can fill the roles.

This crystal structure has a unit lattice of, for example, cubic crystal, tetragonal crystal or orthorhombic crystal, and the ions A and B are positioned at vertexes and body centers, respectively. In a cubic lattice in which the ion B is centered, the ion X is positioned at each face center. In this crystal structure, the unit lattice includes an octahedron consisting of one B ion and six X ions. This octahedron interacts with the ions A, and thereby is readily distorted to undergo phase transition into a symmetrical crystal. This phase transition drastically changes the crystal properties, so that electrons or holes are released out of the crystal. In this way, electricity is presumed to be generated.

If the active layer is thickened, the amount of absorbed light increases and accordingly the short circuit current density (Jsc) is enhanced. On the other hand, however, the carrier transport distance also extends and accordingly loss due to deactivation tends to increase. For the purpose of obtaining the maximum efficiency, the thickness is preferably 30 to 1000 nm, more preferably 60 to 600 nm.

Actually, for example, the device according to the embodiment and other common devices can be made to have the same conversion efficiencies under sunlight exposure conditions by individually controlling the thicknesses of their active layers. However, under the conditions of as low illuminance as 200 lux, the device of the embodiment can realize a higher efficiency than common devices because having the active layer different from them in properties.

(First and Second Buffer Layers 12 and 14)

The first or second buffer layer 12 or 14 is placed between the active layer and the first or second electrode, respectively. If they are provided, one of them serves as a hole transport layer while the other serves as an electron transport layer. Those layers are preferably formed so that the device can achieve high conversion efficiency, but are not necessarily indispensable. Either or both of them may be omitted. Further, either or both of the first and second buffer layers 12 and 14 may have a layered structure of different materials.

The electron transport layer has a function of transporting electrons efficiently. If serving as the electron transport layer, the buffer layer preferably contains a halogen compound or a metal oxide. Preferred examples of the halogen compound include LiF, LiCl, LiBr, LiI, NaF, NaCl, NaBr, NaI, KF, KCl, KBr, KI and CsF. Among them. LiF is particularly preferred.

Examples of the metal oxide includes oxides of titanium, molybdenum, vanadium, zinc, nickel, lithium, potassium, cesium, aluminum, niobium, tin, and barium. Further, it is also preferred to adopt complex oxides containing plural metal elements, such as, aluminum-doped zinc oxide (AZO) and niobium-doped titanium oxide. Among them, titanium oxide is preferred. Further, it is particularly preferred to use amorphous titanium oxide, which is obtained by hydrolysis of titanium alkoxide in sol-gel process.

Further, the electron transport layer can comprise inorganic materials such as metal calcium.

If formed in the photoelectric conversion device of the embodiment, the electron transport layer preferably has a thickness of 20 nm or less. This is because that thickness lowers the film resistance of the electron transport layer to enhance the conversion efficiency. On the other hand, the thickness can be 5 nm or more. The electron transport layer thicker than a particular thickness can show hole-blocking effect fully enough to prevent generated excitons from deactivating before releasing electrons and holes. As a result of the effect, electric currents can be efficiently extracted.

As the n-type organic semiconductor, fullerenes and derivatives thereof are preferably adopted but not limited thereto. The derivatives have, for example, basic skeletons of $C_{60}$, $C_{70}$, $C_{76}$, $C_{78}$ and $C_{84}$. In those fullerene derivatives, carbon atoms in the fullerene skeletons may be modified with desired functional groups, which may combine with each other to form rings. The fullerene derivatives include fullerene polymers. The fullerene derivatives preferably contain functional groups having such high affinity to solvents that they can have high solubility therein.

Examples of the functional groups in the fullerene derivatives include: hydrogen; hydroxyl; halogen atoms, such as, fluorine and chlorine; alkyl groups, such as, methyl and ethyl; alkenyl groups, such as, vinyl; cyano; alkoxy groups, such as, methoxy and ethoxy; aromatic hydrocarbon groups, such as, phenyl and naphthyl; and aromatic heterocyclic groups, such as, thienyl and pyridyl. Concrete examples of the n-type organic semiconductor include: hydrogenated fullerenes of $C_{60}H_{36}$ and $C_{70}H_{36}$, oxide fullerenes of $C_{60}$ and $C_{70}$, and fullerene metal complexes.

Among the above, it is particularly preferred to use [60]PCBM ([6,6]-phenyl$C_{61}$butyric methyl ester) or [70] PCBM ([6,6]-phenyl$C_{71}$butyric methyl ester) as the fullerene derivative.

Further, as the n-type organic semiconductor, it is also possible to use a low molecular-weight compound capable of forming a film by vapor deposition. Here, the "low molecular-weight compound" means a compound whose number- and weight-average molecular weights (Mn and Mw) are the same and 10,000 or less. It is particularly preferred to adopt BCP (bathocuproine), Bphen (4,7-diphenyl-1,10-phenanthroline), TpPyPB (1,3,5-tri(p-pyridine-3-yl-phenyl) benzene) or DPPS (diphenyl bis(4-pyridine-3-yl) phenyl)silane).

The hole transport layer has a function of transporting holes efficiently. If serving as the hole transport layer, the buffer layer can contain a p-type or n-type organic semiconductor material. Here, the "p-type or n-type organic semiconductor material" means a substance capable of serving as an electron donor or acceptor material when used in formation of a hetero- or bulkhetero-junction.

The p-type organic semiconductor can be employed as a material of the hole transport layer. For example, the p-type organic semiconductor preferably contains a copolymer comprising a donor unit and an acceptor unit. It is possible to use fluorine, thiophene and the like as the donor unit. As the acceptor unit, benzothiadiazole and the like can be used. Examples of the material usable for the hole transport layer include: polythiophene and derivatives thereof, polypyrrole and derivatives thereof, pyrazoline derivatives, arylamine derivatives, stilbene derivatives, triphenyldiamine derivatives, oligothiophene and derivatives thereof, polyvinyl carbazole and derivatives thereof, polysilane and derivatives thereof, polysiloxane derivatives having aromatic amines in their main or side chains, polyaniline and derivatives thereof, phthalocyanine derivatives, porphyrin and derivatives thereof, polyphenylenevinylene and derivatives thereof, polythienylenevinylene and derivatives thereof, benzodithiophene and derivatives thereof, and thieno[3,2-b] thiophene and derivatives thereof. Those materials may be combined to use for the hole transport layer. Further, it is also possible to use copolymers composed of comonomers constituting the above materials. Among the above, polythiophene and derivatives thereof are preferred because they have excellent steric regularity and relatively high solubility in solvents.

Furthermore, the hole transport layer may be formed by use of derivatives of copolymer containing carbazole, benzothiadiazole and thiophene. Examples of those derivatives include poly[N-9'-heptadecanyl-2,7-carbazole-alt-5,5-(4',7'-di-2-thienyl-2',1',3'-benzothiadiazole)] (hereinafter, often referred to as "PCDTBT). In addition, also preferred are copolymers of benzodithiophene (BDT) derivatives and thieno[3,2-b]thiophene derivatives. Preferred examples thereof include: poly[[4,8-bis[(2-ethylhexyl)oxy]benzo[1,2-b:4-5-b']dithiophene-2,6-dyl][3-fluoro-2-[(2-ethylhexyl) carbonyl]thieno[3,4-b]thiophenedyl]] (hereinafter, often referred to as "PTB7"); and PTB7-Th (often referred to as "PCE10" or "PBDTTT-EFT"), which contains thienyl group having weaker electron donatability than the alkoxy group in PTB7. Still further, it is still also possible to adopt metal oxide as the material of the hole transport layer. Preferred examples of the metal oxide include titanium oxide, molybdenum oxide, vanadium oxide, zinc oxide, nickel oxide, lithium oxide, calcium oxide, cesium oxide and aluminum oxide. They have the advantage of being inexpensive. As the material of the hole transport layer, thiocyanates such as copper thiocyanate are also employable.

The above p-type organic semiconductors and other transport layer materials, such as spiro-OMeTAD, can be doped with dopants. Examples of the dopants include: oxygen, 4-tert-butylpyridine, lithium-bis(trifluoromethanesulfonyl) imide (Li-TFSI), acetonitrile, tris[2-(1H-pyrazole-1-yl)pyridine]cobalt (III) tris(hexafluorophosphate) (commercially available under the trade name of "FK102 [trademark]"), and tris[2-(1H-pyrazole-1-yl) pyrimidine]cobalt (III) tris[bis(trisfluoromethylsulfonyl)imide) (MY11).

The hole transport layer can be formed by use of electroconductive polymer compounds, such as, polyethylenedioxythiophene. The electroconductive polymer compounds described above for the electrodes are also employable. Also, as for the hole transport layer, polythiophene-type polymers such as PEDOT can be combined with other compounds to prepare a material having a work function suitable for transporting holes. Specifically, the work function of the hole transport layer is preferably controlled to be lower than the valence band of the aforementioned active layer.

The above-described second buffer layer preferably serves as a hole transport layer, and also preferably is a layer of metal oxide selected from the group consisting of oxides of zinc, titanium, aluminum and tungsten. This oxide layer may be made of complex metal oxides containing two or more metals. That is because electroconductivity of the layer is so improved due to the light-soaking effect that the power generated in the active layer can be efficiently extracted. The layer is placed on the second electrode-side of the active layer so that the light-soaking effect can be caused by light, particularly, by UV light passing through the barrier layer and the second buffer layer. Even if the substrate is a UV light-shielding plate, such as a polymer plate, the light-soaking effect can be caused by light coming from the second electrode-side. If the electroconductivity can be maintained for a long time, there is no problem even if the layer subjected to light soaking is thereafter covered with an opaque or semi-transparent material.

As shown in FIG. 1, the second buffer layer preferably has a layered structure in which two or more sublayers are stacked.

In the layered structure, the sublayer adjacent to the barrier layer is preferably a metal oxide layer described above. If the second buffer layer has that structure, the active layer and the buffer sublayer adjacent to the active layer hardly suffer from damages when the barrier layer is formed by sputtering.

Further, the second buffer layer preferably has a structure containing voids. The structure is, for example, made of nanoparticle sediments among which voids are formed, or made of nanoparticle aggregates among which voids are formed. The barrier layer is placed between the second electrode and the second buffer layer so as to protect the second electrode from corrosion caused by substances oozing from other layers. Meanwhile, substances contained in the perovskite layer tend to have high vapor pressures at a high temperature, and hence gases such as halogen, halogenated hydrogen and methyl ammonium are often generated in the perovskite layer. If the gases are confined with the barrier layer, the inner pressure may increase to damage the device internally. Specifically, the layers are liable to separate at the interfaces. If the second buffer layer contains voids, the increase of inner pressure can be reduced to improve durability of the device.

(Barrier Layer)

The semiconductor element according to the embodiment further comprises a barrier layer placed between the active layer and the second electrode. The barrier layer is made of light-transparent metal oxide.

The barrier layer structurally separates the active layer from the second electrode made of metal. Consequently, the second electrode is protected from corrosion caused by substances oozing from other layers. Particularly if the active layer is made of perovskite semiconductor, halogen ions such as iodide and bromide ions are known to ooze from the active layer and then diffuse in the element. When a portion of the diffusing ions reaches the metal electrode, they are known to cause corrosion. The barrier layer is thought to effectively prevent those substances from diffusing. If the semiconductor element is provided with the second buffer layer, the barrier layer is preferably placed between the second buffer layer and the second electrode. That is because the buffer layer thus positioned can also prevent diffusion of substances released from the second buffer layer.

The barrier layer preferably contains indium-tin oxide (ITO), fluorine-doped tin oxide (FTO) or aluminum-doped zinc oxide (AZO). The thickness of the barrier layer is preferably 5 to 100 nm, more preferably 10 to 70 nm. If the barrier layer has that structure, light can reach the active layer and the second buffer layer when coming from the second electrode side. Accordingly, if the second electrode side is irradiated with light, particularly, UV light, electroconductivity is so improved due to the light-soaking effect that the power generated in the active layer can be efficiently extracted The barrier layer can be made of the same metal oxides as those generally used for electrodes. However, the barrier layer is preferably different in characteristics from usual metal oxide layers serving as electrodes. This means that the barrier layer is characterized not only by the constituting materials but also by crystallinity or oxygen content. From a qualitative viewpoint, the crystallinity or oxygen content of the barrier layer is lower than that of metal oxide layers generally formed as electrodes by sputtering. Specifically, the barrier layer preferably has an oxygen content of 62.1 to 62.3 atom %. This oxygen content is higher than that of a metal oxide layer serving as the buffer layer. When a metal oxide layer is formed to be the buffer layer, a wet-coating process is generally adopted so as not to damage the adjacent active layer. However, the thus-formed metal oxide layer has as low a density as 1.2 to 5. In contrast, the barrier layer according to the embodiment has a density of 7 or more. If the barrier layer is positioned on the side opposite to the light-receiving surface in the structure according to the embodiment, there is no fear that the active layer and the buffer layer are decomposed even if the barrier layer comprises metal oxide having photocatalytic activity. Here, the "light-receiving surface" means the element surface mainly exposed to light.

Whether or not the barrier layer fulfils the function of preventing diffusion of deteriorating substances can be verified by analyzing the element distribution in the sectional direction after a durability test. For the purpose of that, time-of-flight secondary ion mass spectrometry (hereinafter, referred to as "TOF-SIMS") or the like can be employed. The device according to the embodiment can be subjected to the TOF-SIMS analysis so as to measure various element distributions versus the distance (depth) from the surface on the second electrode-side. Deteriorating substances such as iodine can relatively freely diffuse in a device not comprising the barrier layer. In contrast, in the device comprising the barrier layer, the barrier layer prevents diffusion of deteriorating substances. In the device according to the embodiment, even if deteriorating substances oozes from the active layer, the barrier layer prevents them from reaching to the second electrode. If the device of the embodiment is analyzed by TOF-SIMS, the resultant chart typically shows two or more divided deteriorating substance peaks positioned on both sides of the peak corresponding to the barrier layer material, such as, indium oxide. The deteriorating substance peaks positioned on the second electrode-side of the barrier layer peak are due to deteriorating substances that the barrier layer failed to stop. Accordingly, if the barrier layer fulfils the function of preventing diffusion of deteriorating substances, the peak area on the second electrode-side is smaller than other peak areas. Further, if the barrier layer completely stops diffusion of the deteriorating substances, the peak area on the second electrode-side disappears. Hence, the deteriorating substance peaks on the second electrode-side preferably have small intensities. If the barrier layer stops most of the deteriorating substances, the durability is remarkably improved.

Specifically, even if the deteriorating substances penetrate the barrier layer in only a small amount and thereby only a part of the second electrode is damaged, the characteristics such as electrical resistivity of the second electrode are not largely changed and hence there is no appearance of large change in the conversion efficiency of the solar cell. On the other hand, if the barrier layer is not provided, the second electrode may be seriously damaged by the deteriorating substances and, as a result, the conversion efficiency of the solar cell may be extremely lowered. The deteriorating substance peak area on the second electrode-side is preferably 0.007, more preferably almost 0 in a ratio to the total area of the other deteriorating substance peaks.

The above barrier layer can be formed by sputtering under particular conditions (the details are described later).

If the second electrode containing aluminum or silver is adopted in combination with the barrier layer, it becomes unnecessary to use gold, which is generally employed as an electrode material for improving durability of the semiconductor element. The cost of gold for electrodes is about 15000 yen/m$^2$ while that of ITO, aluminum or silver is 100 to 1000 yen/m$^2$, about 1 yen/m$^2$ or about 200 yen/m$^2$, respectively. Accordingly, it becomes possible to provide an inexpensive and durable photoelectric conversion device.

Thus, the structure of the photoelectric conversion device according to the present embodiment is explained in the above description. The aforementioned active layer having a perovskite structure can function also as a light-emitting layer. Accordingly, the semiconductor element having the structure according to the embodiment can work as not only a photoelectric conversion device but also a light-emitting device.

[Method for Manufacturing Semiconductor Elements]

Except that the barrier layer is formed, the semiconductor element according to the embodiment can be manufactured in the same manner as known normal semiconductor elements. Accordingly, there are no particular restrictions on the materials and formation processes of the substrate, of the first and second electrodes, of the active layer and of the buffer layers optionally formed thereon. The method for manufacturing the semiconductor element according to the embodiment is explained below.

First, the first electrode is provided on the substrate. The electrode can be formed by any process, which is selected from, for example, vacuum deposition, sputtering, ion-plating, normal plating, wet-coating or the like.

Subsequently, according to necessity, the buffer layer and/or an undercoat layer are formed thereon. The buffer layer can be also formed by a process selected from vacuum deposition, sputtering, ion-plating, normal plating, wet-coating or the like. The undercoat layer (described later in detail) is normally formed by wet-coating.

The active layer is then formed on the electrode directly or via the buffer layer or the undercoat layer.

In the method of the embodiment, the active layer can be formed by any method. However, in view of the cost, it is advantageous to form the active layer by a wet-coating process. For example, the active layer containing perovskite semiconductor is preferred because it can be formed by wet-coating. Specifically, the first electrode or the first buffer layer is coated with a coating solution containing precursor compounds for forming the perovskite structure and an organic solvent capable of dissolving the precursor compounds, to form a coating film.

Examples of the solvent include N,N-dimethylformamide (DMF), γ-butyrolactone and dimethyl sulfoxide (DMSO). There are no particular restrictions on the solvent used in the coating solution as long as it can dissolve the materials, and the solvent may be a mixed solvent. The coating solution can be prepared by dissolving two or more starting materials for forming the perovskite structure in a solvent. Otherwise, two or more starting materials for forming the perovskite structure may be individually dissolved in solvents, and then the obtained solutions are one-by-one cast by means of coating machine, such as, spin coater, slit coater, bar coater, or dip coater.

The coating solution may contain additives. Preferred examples of the additives include 1,8-diiodooctane (DIO) and N-cyclohexyl-2-pyrrolidone (CHP).

It is generally known that, if the element structure includes a mesoporous structure therein, leak currents between the electrodes are reduced even when pinholes, cracks and/or voids are formed in the active layer. This effect can hardly be obtained if the element structure includes no mesoporous structure therein. However, if the coating solution in the embodiment contains plural materials for the perovskite structure, the active layer less undergoes volume shrinkage in its formation and consequently the obtained layer tends to have a small number of pinholes, cracks and/or voids. In addition, if another solution containing methylammonium iodide (MAI), metal halogen compounds and the like is further cast thereon after the coating solution is applied, reactions with unreacted metal halogen compounds proceed and consequently the obtained layer tends to have a much smaller number of pinholes, cracks and/or voids. It is, therefore, preferred to coat the active layer with the MAI-containing solution after the coating solution is cast thereon.

The coating solution containing the precursor compounds for the perovskite structure may be applied twice or more. In that case, the active layer formed by the first application is liable to be cause lattice mismatch and hence the solution is preferably so applied that the formed layer may have a relatively thin thickness. The coating conditions of the second or later application are also preferably controlled so that the formed layer may have a relatively thin thickness. For example, the spin coater may be operated at a high rotation rate, the slit coater or bar coater may be worked at a relatively small slit width, the dip coater may be run at a relatively high pull speed, or the coating solution may be so prepared as to contain the solute in a relatively low concentration.

After the reaction is completed to form the perovskite structure, the obtained perovskite layer is preferably annealed and thereby dried to remove the solvent. For the purpose of removing the solvent from the perovskite layer, the annealing procedure is preferably carried out before the perovskite layer is coated with the buffer layer. The annealing temperature is preferably 50° C. or more, further preferably 90° C. or more, but preferably 200° C. or less, further preferably 150° C. or less. If it is too low, there is a problem of removing the solvent insufficiently. On the other hand, if the temperature is too high, the surface of the perovskite layer may be roughened too seriously to obtain a smooth surface.

(Undercoat Layer)

Before the active layer is formed, it is possible to form an undercoat layer in addition to or in place of the first or second buffer layer.

The undercoat layer preferably comprises a low molecular weight compound. Here, the "low molecular weight compound" means a compound whose number- and weight-average molecular weights Mn and Mw are the same and 10,000 or less. Examples thereof include: organic sulfur compounds, organic selenium and tellurium compounds, nitrile compounds, monoalkylsilanes, carboxylic acids, phosphonic acids, phosphoric esters, organic silane compounds, unsaturated hydrocarbons, alcohols, aldehydes, alkyl bromides, diazo compounds, and alkyl iodides. For example, 4-fluorobanzoic acid (FBA) is preferred.

The undercoat layer can be formed by casting and drying a coating solution containing the low molecular weight compound described above. The undercoat layer is effective in that the carrier collection efficiency from the perovskite layer to the electrodes can be improved by the action of vacuum level shift caused by dipoles, in that the perovskite layer can be improved in crystallizability, in that formation of pinholes can be inhibited in the perovskite layer, and in that incident light can be more transmitted through the light-receiving surface. As a result, the current density is increased, and the fill factor is improved, and accordingly the photoelectric conversion efficiency or the luminous efficiency are enhanced. Particularly when the perovskite structure is formed on the electrode or on the buffer layer of large lattice mismatch-containing crystal system other than titanium oxide or aluminum oxide, the undercoat layer is provided so as to function by itself as a stress relaxation layer or so as to give the stress relaxation function to the perovskite structure in a part near the undercoat layer. Thus, the undercoat layer not only improves crystallizability of the perovskite layer but also relaxes the internal stress generated by crystal growth to inhibit pinholes and to realize excellent interface bonding.

[Formation Process of Barrier Layer]

The barrier layer can be formed by sputtering, vacuum deposition, physical vapor deposition (PVD), chemical vapor deposition (CVD), wet-coating, spin-coating, or spray-coating. However, in any process, there is a fear that the photoelectric conversion layer and/or the buffer layer may be damaged. If they are damaged, the resultant photoelectric conversion device may have poor conversion efficiency or may work unstably. The damage is thought to be caused by oxygen, heat, UV and deteriorating substances (e.g., ions, compounds, gases). Accordingly, in order to obtain the semiconductor element having excellent properties, it is important to avoid them.

In the embodiment, the barrier layer is preferably formed by sputtering. However, in a sputtering process, the damage may be mainly caused by:
(1) reverse sputtering of incident ions, such as argon ions, reflected by the target,
(2) γ-electrons generated in the discharge phenonium,
(3) UV rays radiated from oxygen introduced as the reactive gas, and
(4) reactions with radical species such as oxygen radicals generated from the reactive gas.

The above (1) and (2) can be avoided by controlling the input power at a minimum required level. Specifically, the input power is preferably reduced to 1200 W or less. It is more preferred to use an input power of 200 to 300 W supplied from a DC power source. For example, the voltage and the current are set to be 400 V and 0.6 A, respectively. In this way, the current is preferably as small as less than 1 A. The reactive gas such as oxygen is reduced, and accordingly oxygen supplied from the target can be increased.

Further, if γ-electrons are confined with magnetic force lines, for example, in a magnetron sputtering coater or in a facing-target sputtering apparatus, the damage caused by γ-electrons can be avoided.

If the reactive gas is not used or used only in a small amount, the damage caused by (3) and (4) can be avoided.

Since the reactive gas is thus reduced, the resultant barrier layer is characterized by having a small oxygen content in the elemental composition. Specifically, the barrier layer preferably has an oxygen content of 62.1 to 62.3 atom %. This oxygen content is smaller than that of the metal oxide layer serving as the light-receiving side electrode. Accordingly, if the first electrode is made of ITO, the oxygen content in the elemental composition of the barrier layer is smaller than that of the first electrode. According as the oxygen content decreases, the electric resistivity and the transparency tend to be impaired. In view of that, the barrier layer preferably has a thin thickness. The thickness is preferably 100 nm or less, more preferably 10 to 50 nm. The thicker the thickness is, the longer it takes to form the layer and hence the more the cost for forming the layer increases. Accordingly, since the layer can be thus thinned, it is advantageous to provide an inexpensive and durable device.

In conventional evaluation tests of elements comprising perovskite structures, the power generation areas of evaluated samples were as small as about 2 mm squares. The elements comprising perovskite structures are generally produced in film-forming processes including reactions of crystal growth, and hence have problems in that internal stress is induced by volume shrinkage to generate pinholes or to cause intercoat adhesion failures. For that reason, it was difficult to produce layered structures having small amounts of structural defects. Accordingly, in mass-production processes, conversion efficiencies of the products were poor in reproducibility and varied in a wide range. Although there were some cases where a portion of the products happened to have defects fortuitously in small amounts and to show irregularly high conversion efficiencies, it was difficult to obtain high conversion efficiencies regularly and widely.

However, in view of practical use, it is necessary to manufacture elements capable of realizing high conversion efficiencies in wide ranges. In the following examples, therefore, elements having power generation areas of 1 cm squares were produced and evaluated. In a normal solar cell-manufacturing process including a wet-coating procedure, cells in shapes of 1 cm-width strips are sequentially arranged. Accordingly, the elements having power generation areas of 1 cm squares are suitable in size for serving as samples of practical module performance.

EXAMPLES

Example 1

An ITO film as the first electrode was formed on a glass substrate, and a hole transport layer was then formed thereon. Thereafter, a perovskite layer as the photoelectric conversion layer was formed. The perovskite layer was produced by a two-step process according to N. 3. Jeon, J. H. Noh, Y. C. Kim, W. S. Yang, S. Ryu and S. I. Seok: Solvent engineering for high-performance inorganic-organic hybrid perovskite solar cell, Nat. Mater. 13, 897 (2014). Under a nitrogen atmosphere in a glovebox, first a DMF solution containing lead iodide ($PbI_2$) and the same or more amount of DMSO was applied by spin-coating and then an isopropyl alcohol (IPA) solution of methylammonium iodide (MAI) was applied thereon by spin-coating. The obtained coating film was annealed at 135° C. for 30 minutes to form a perovskite structure of $MAPbI_3$. The film was further spin-coated with PCBM dissolved in dichlorobenzene to form an electron transport layer. Thus, a layered structure was produced. The formed PCBM layer was 100 nm thick. In the embodiment, an AZO layer was further formed by spin-coating with an AZO nanoparticle dispersion (N-20X [trademark], manufactured by Nanograde AG) and then annealing at 75° C. The formed layer was about 50 nm thick. The obtained structure was placed in a sputtering apparatus, and an ITO film as the barrier layer was formed by sputtering. The sputtering pressure, input power and deposition rate were 2.7 mTorr, 0.9 kW and 0.408 angstrom/second, respectively. The sputtering was carried out in argon gas, and reactive gases such as oxygen were not introduced. The formed layer was about 43 nm thick. Subsequently, an about 60 nm-thick silver metal film was formed in a vacuum deposition apparatus. Finally, a glass plate was attached with UV curable resin to seal the layered structure.

Figure 2:
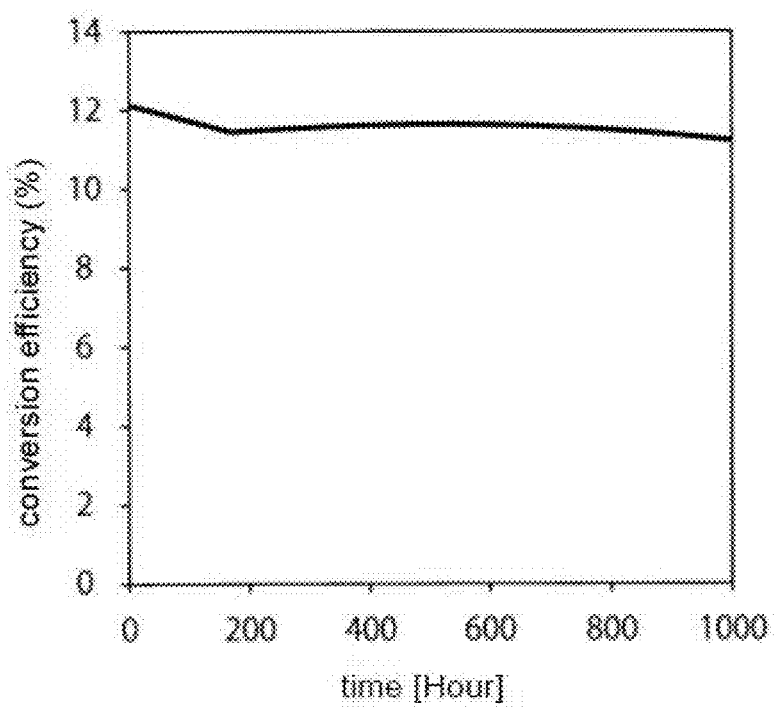
FIG. 2 shows heat-resistance of the element according to Example 1.
Figure 3:
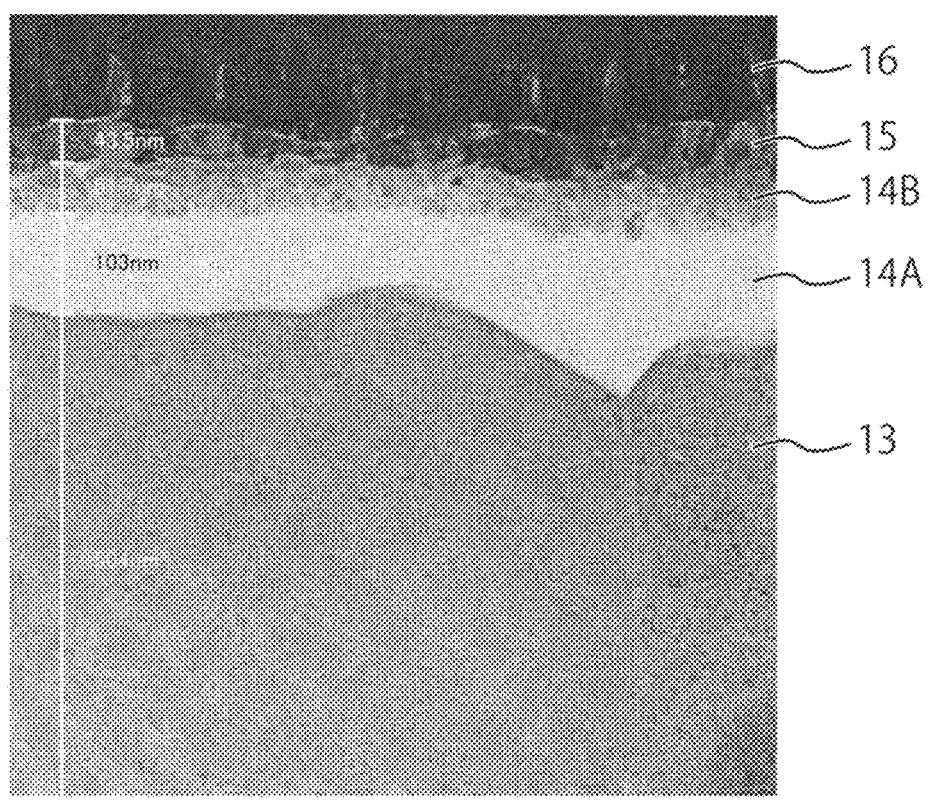
FIG. 3 shows a sectional electron microscope image of the element according to Example 1.

FIG. 2 shows a result of a heat-resistance test of the semiconductor element (solar cell) according to Example 1. After a glass plate was attached to the substrate with UV curable resin to seal the element, the element was stored at 85° C. according to JIS8938 so as to evaluate the heat-resistance. The heat-resistance tests of other Examples were also carried out in the same manner. The conversion efficiency plotted on the vertical axis was measured by means of a solar simulator. During the measurement, the backside of the element was kept irradiated with pseudo sunlight to undergo light soaking. Hereinafter, unless otherwise described, the conversion efficiency was measured in the same manner. FIG. 2 indicates that the solar cell of the embodiment showed a degradation rate of 10% or less even after 1000 hours. Here, the "degradation rate" means a lowering ratio of the conversion efficiency to the initial efficiency. FIG. 3 shows a sectional electron microscope image of the element under that situation. The observed sample was cut out of the element according to the FIM (focused ion beam) method. The sample was about 100 nm thick. The observation was carried out by means of a transmission electron microscope (H-9000NAR [trademark], manufactured by Hitachi High-Technologies Corporation) at an accelerating voltage of 200 kV. From the microscope image, it can be verified that the active layer, the two buffer layers, the barrier layer and the homogeneous electrode are stacked. It can be also verified that one of the buffer layers contains voids in series along not only the layered direction but also other directions.

Table 1 shows electric resistances of two ITO films contained in the semiconductor element of Example 1. Those ITO films serve as the first electrode and the barrier layer, and have different electric resistances. That is because ITO films having different characteristics were adopted so as to reduce damage of the photoelectric conversion layer and the buffer layers. The ITO film serving as the barrier layer has a high electric resistance, and hence it can be understood why the film is preferably as thin as several tens of nanometers. Table 1 also shows oxygen contents, which were measured by means of an X-ray photoelectron spectroscopy instrument (Quantera II [trademark], manufactured by ULVAC-PHI, Inc.). The X-ray source was monochromatic Al (1486.6 eV).

Figure 4:
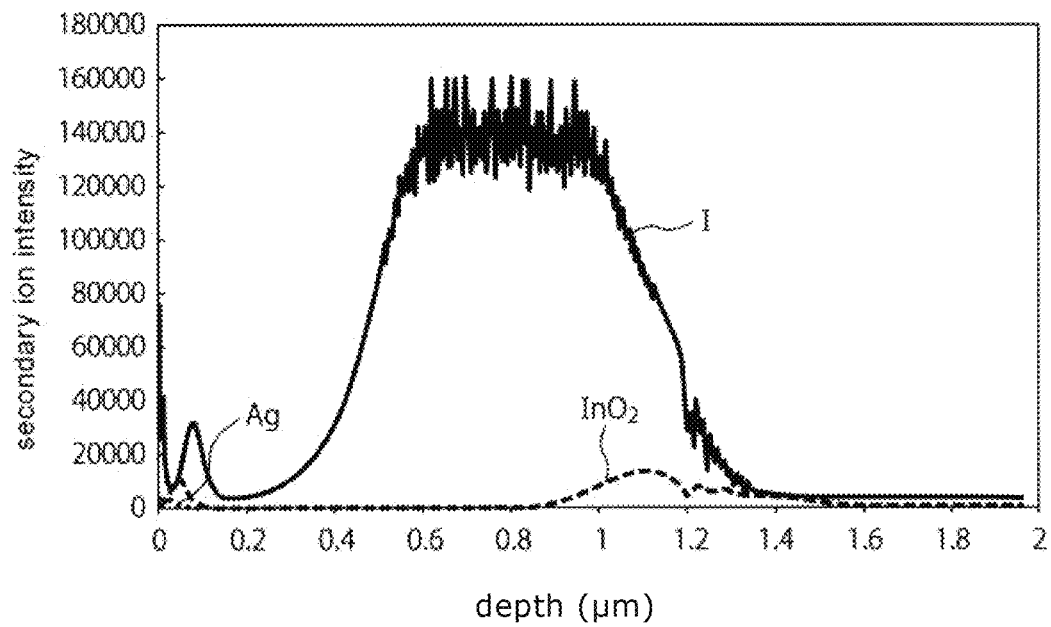
FIG. 4 shows a TOF-SIMS chart of the element according to Example 1.
Figure 5:
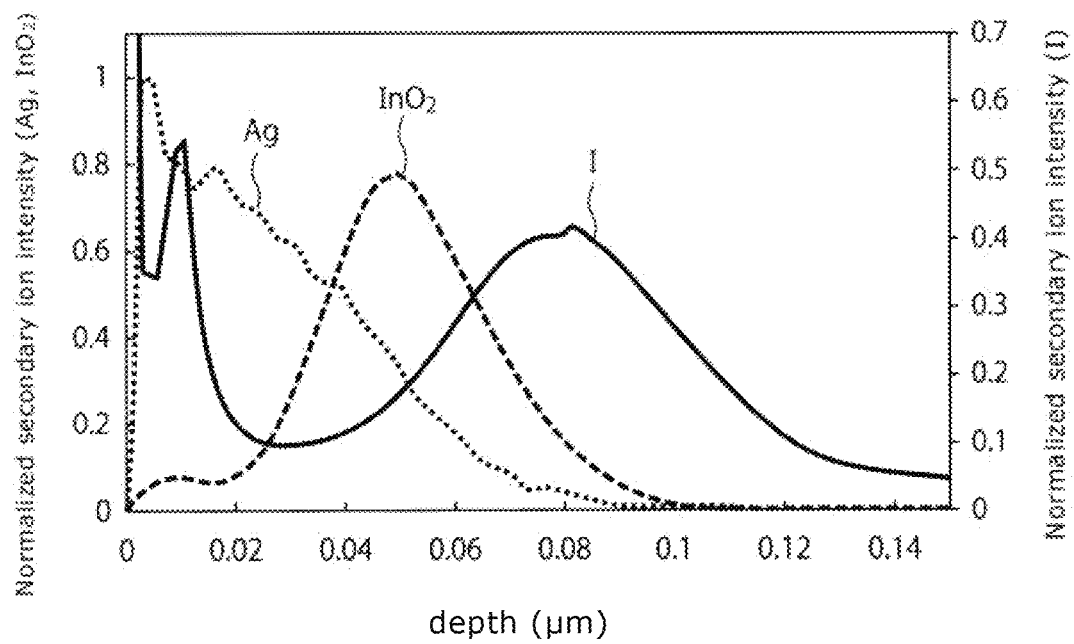
FIG. 5 shows another TOF-SIMS chart of the element according to Example 1.

The element of Example 1 was subjected to a TOF-SIMS analysis, to measure distribution of ions along the sectional direction. The results were shown in FIGS. 4 and 5. FIG. 5 is an enlargement of a part of FIG. 4. The used apparatus was TOF SIMS 5-300 ([trademark], manufactured by IONTOF GmbH). The measurement conditions are as follow:
primary ion conditions
    ion source: $Bi_3^{++}$, accelerating voltage: 30 kV,
    ion current: 0.2 pA, measurement area: 150 μm squares,
    charge correction: performed
sputter conditions
    sputter ion source: Cs, accelerating voltage: 2 kV,
    current: 153.6 mA, sputter area: 450 μm squares.

The second electrode and the barrier layer are considered to be represented by Ag and $InO_2$, respectively. The substance deteriorating the second electrode is represented by I. In the charts, the left area along the X-axis corresponds to the second electrode side. It can be verified that the peak corresponding to the barrier layer is positioned between two peaks corresponding to the deteriorating substance. The peak area of I on the second electrode side was found to be 0.007 based on the total peak area corresponding to I in the other part.

TABLE 1

Electric resistance of ITO film

| | sheet resistance Ω/□ | thickness nm | resistance Ωm | oxygen content atom % |
|---|---|---|---|---|
| first electrode | 9.8 | 150 | $1.47 \times 10^{-6}$ | 62.8 |
| barrier layer | 4089 | 10 | $4.09 \times 10^{-5}$ | 62.3 |

Example 2

Figure 6A:
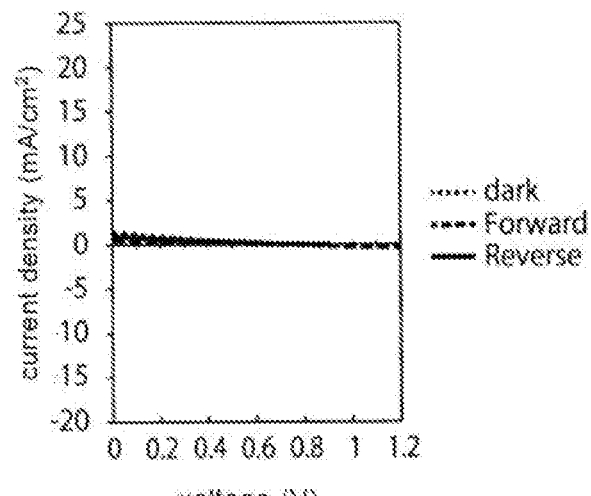
FIGS. 6A to 6C show light soaking effects of the element according to Example 2.
Figure 6B:
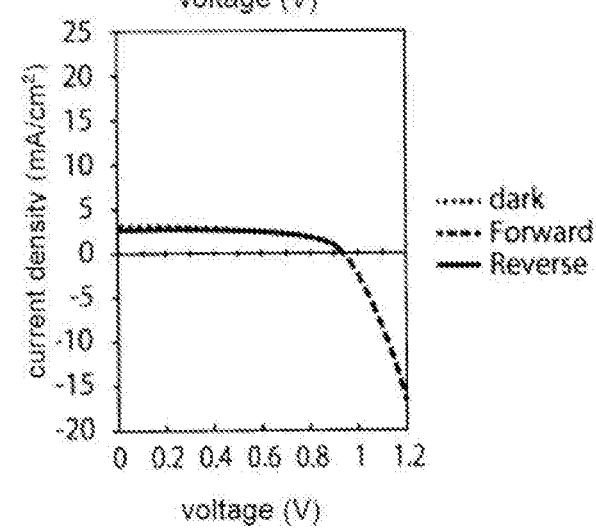
Figure 6C:
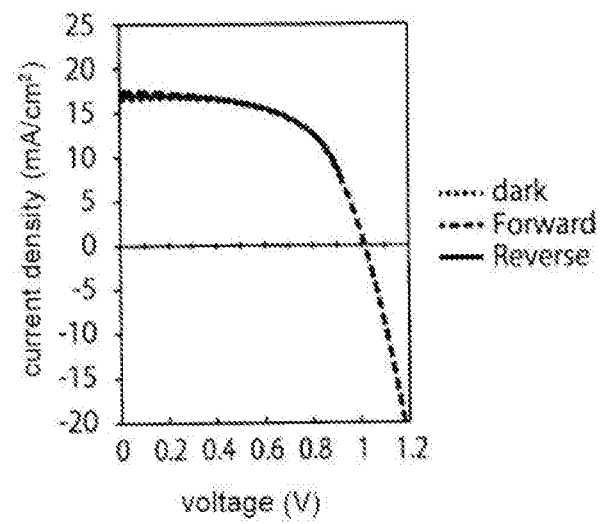

The procedure of Example 1 was repeated except that an ITO film of 300 nm thickness was formed as the first electrode. FIG. 6 shows the light-soaking effect of the obtained element. When the first electrode side was irradiated with light, the conversion efficiency was found to be 0.1% (FIG. 6A). Thereafter, when the second electrode side was then irradiated with light, the conversion efficiency was found to be 1.7% (FIG. 6B). Finally, when the first electrode side was again irradiated with light, the conversion efficiency was found to be 10.3% (FIG. 6C).

Figure 7:
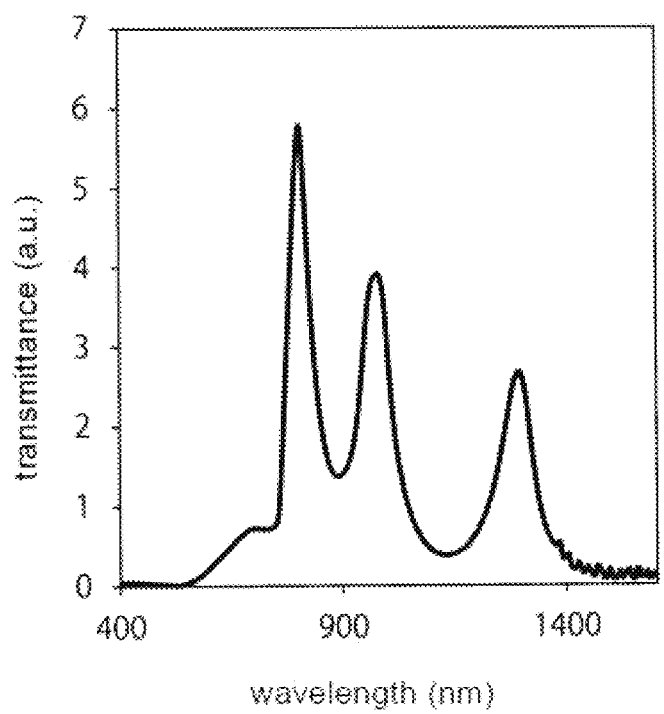
FIG. 7 is a transmission spectrum of the solar cell device according to Example 2.

FIG. 7 shows a transmission spectrum of the solar cell according to Example 2. The mean transmittance and the maximum transmittance were found to be 1.4% (400 to 830 nm) and 5.9% (800 nm), respectively.

Example 3

Figure 8:
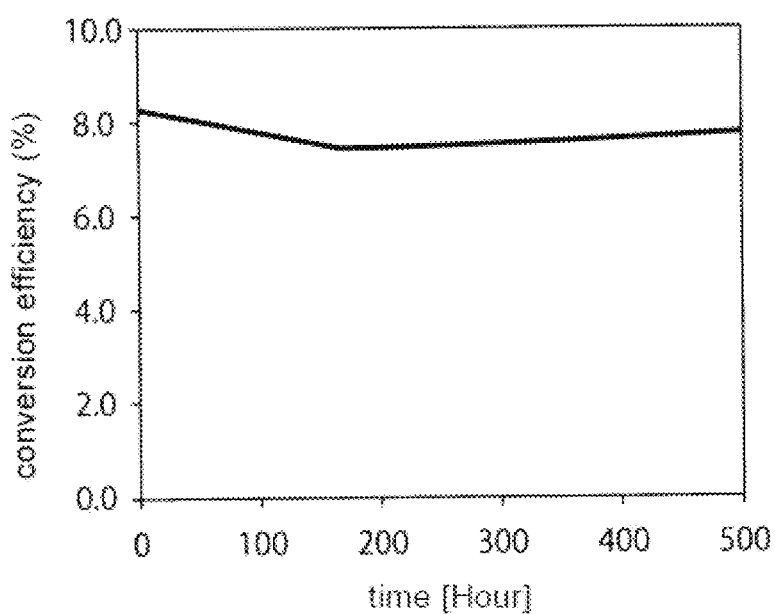
FIG. 8 shows light-resistance of the element according to Example 3.
Figure 9:
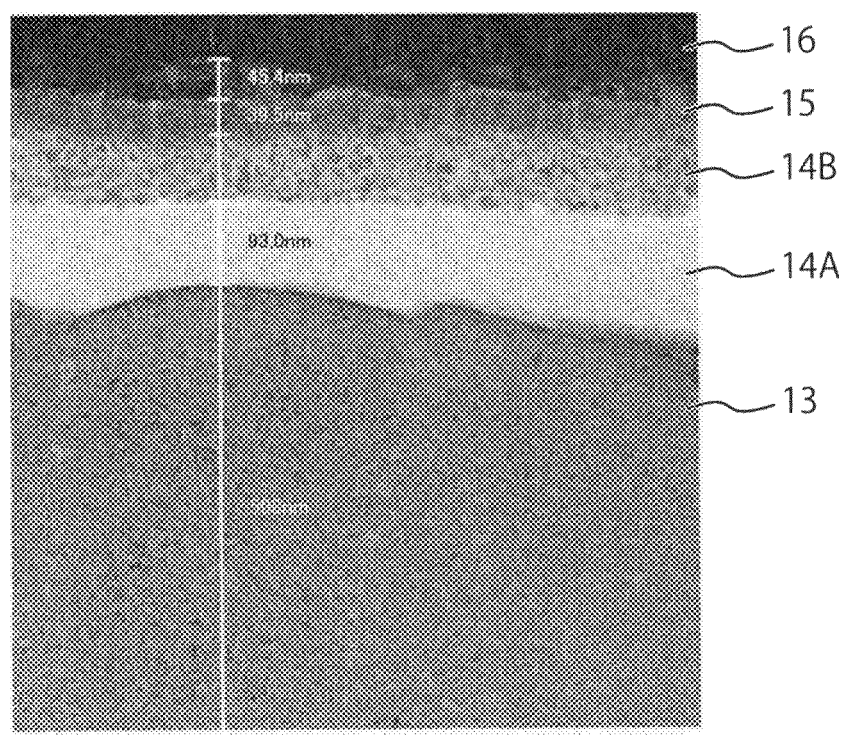
FIG. 9 shows a sectional electron microscope image of the element according to Example 3.

The procedure of Example 1 was repeated except that the AZO layer and the barrier layer were thickened. Specifically, the coating for forming the AZO layer was repeated three times, so that the AZO layer of about 75 nm thickness was formed. The barrier layer was an ITO film of 40 nm thickness. Finally, a glass plate was attached on the substrate with UV curable resin to seal the element. FIG. 8 shows a result of a light-resistance test of the element (solar cell) according to Example 3. The light-resistance test was carried out by continuously irradiating the element with light according to JIS8938. As shown in FIG. 8, the element of the embodiment was found to deteriorate only by 10% or less even after 500 hours. FIG. 9 shows a sectional electron microscope image of the element under that situation. The measurement conditions were the same as those in Example 1. From the microscope image, it can be verified that the active layer, the two buffer layers, the barrier layer and the homogeneous electrode are stacked. It can be also verified that one of the buffer layers contains voids in series along not only the layered direction but also other directions.

Figure 10:
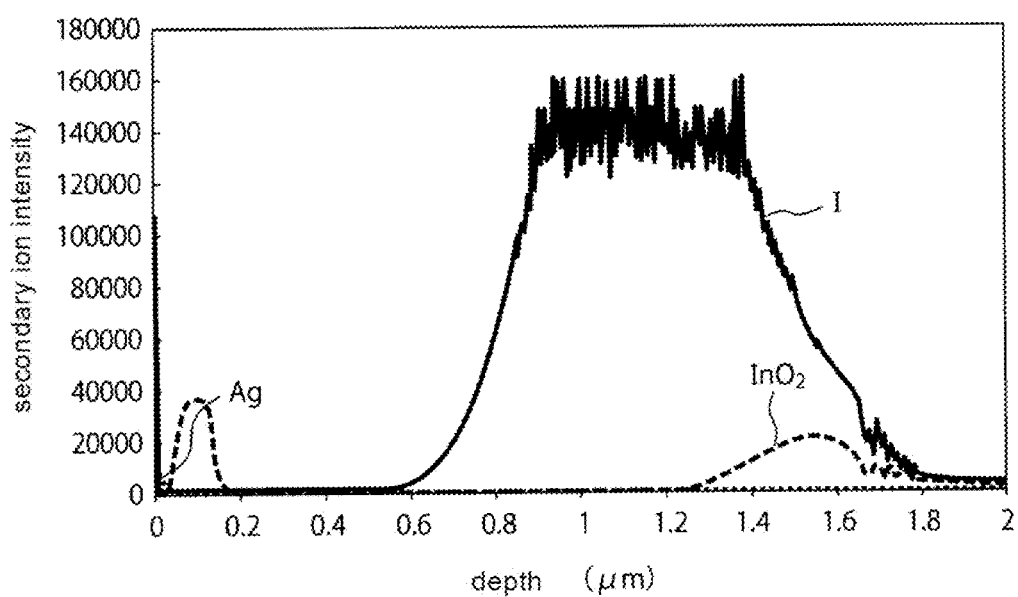
FIG. 10 shows a TOF-SIMS chart of the element according to Example 3.
Figure 11:
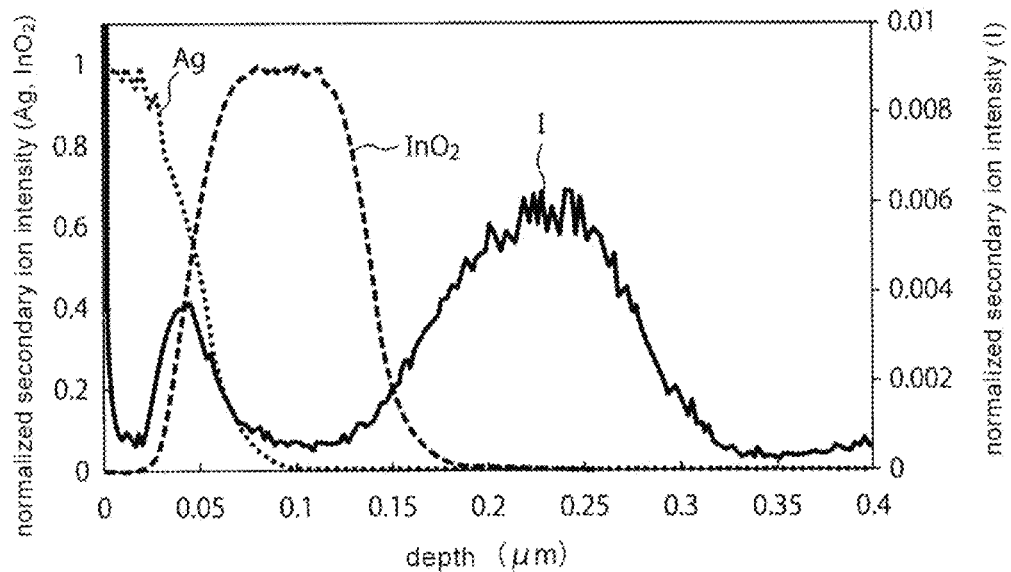
FIG. 11 shows another TOF-SIMS chart of the element according to Example 3.

The element of Example 3 was subjected to a TOF-SIMS analysis, to measure distribution of ions along the sectional direction. The results were shown in FIGS. 10 and 11. The measurement conditions were the same as those in Example 1. It can be also verified that the peak corresponding to the barrier layer is positioned between two peaks corresponding to the deteriorating substance. The peak area of I on the second electrode side was found to be 0.0025 based on the total peak area corresponding to I in the other part.

Comparative Example 1

The procedure of Example 1 was repeated except that the AZO layer and the barrier layer were not formed. However, if a silver layer is formed directly on PCBM, it is clear that the silver layer cannot efficiently collect electrons and hence the conversion efficiency decreases by about half. In view of that, a 10 nm-thick BCP layer as the second buffer layer was inserted therebetween.

Figure 12:
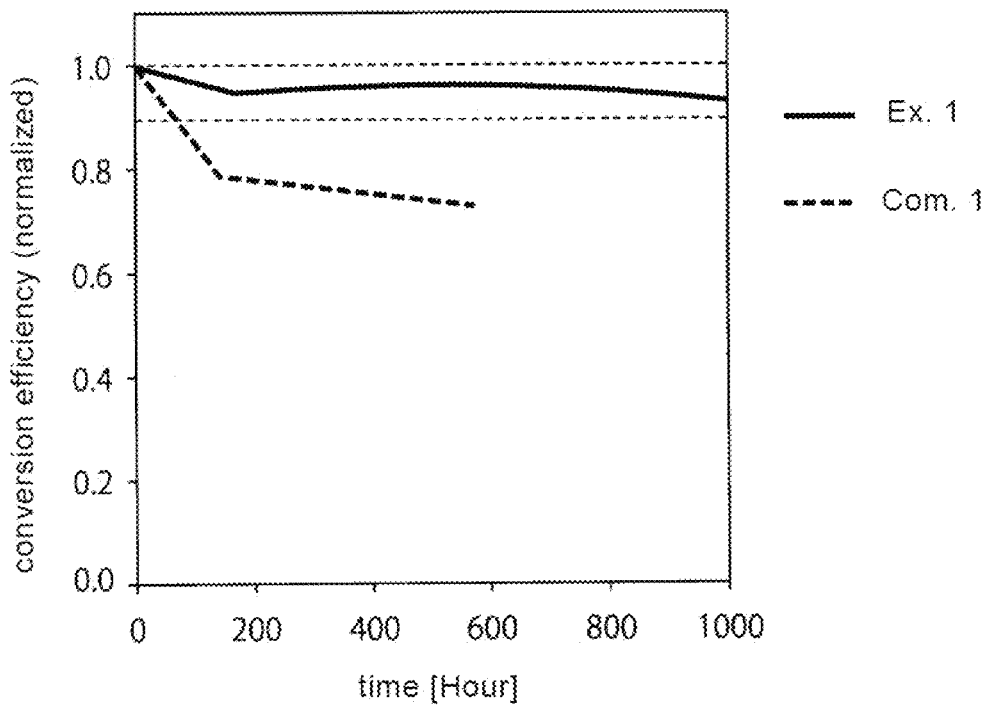
FIG. 12 shows heat-resistance of the elements according to Example 1 and Comparative example 1.
Figure 13:
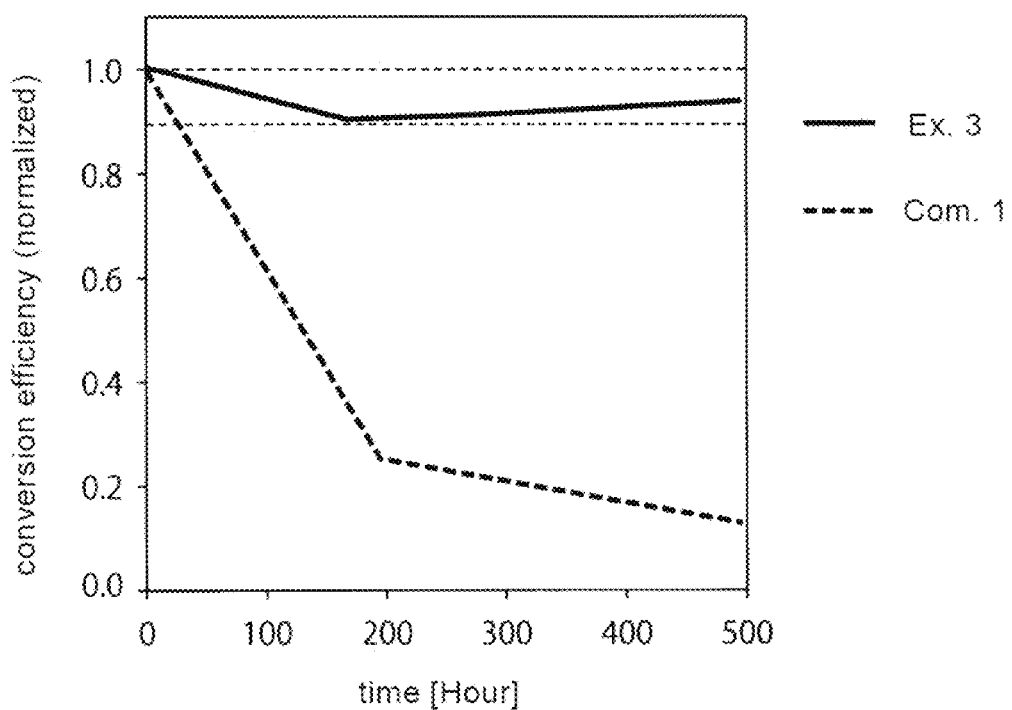
FIG. 13 shows light-resistance of the elements according to Example 3 and Comparative example 1.
Figure 14:
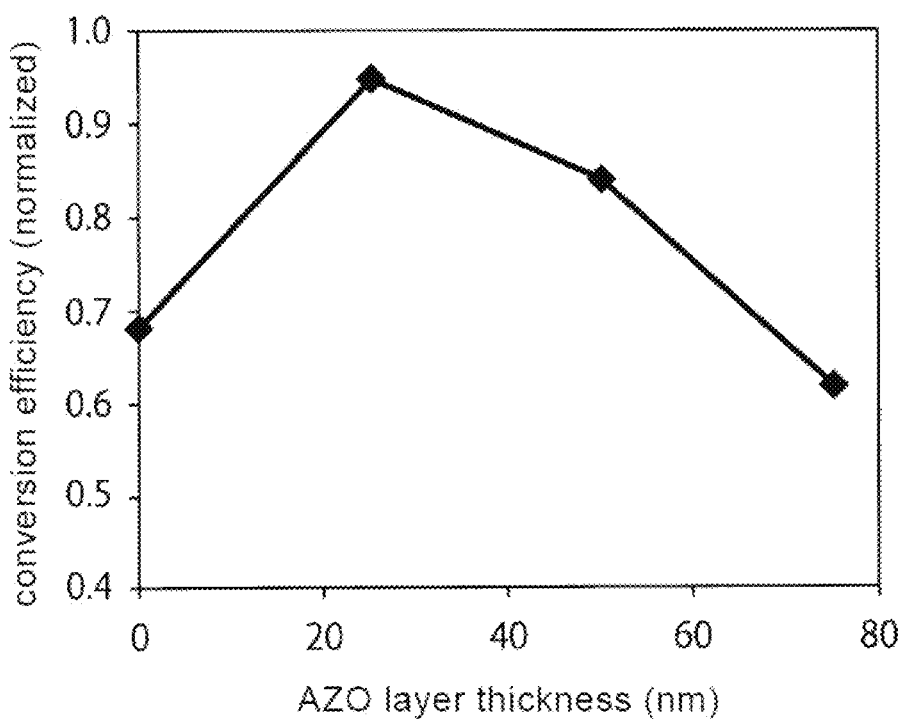
FIG. 14 shows a relation between the conversion efficiency and the thickness of AZO layer.

FIG. 12 shows a result of the heat-resistance test. As evident from FIG. 12, the element not provided with the barrier layer was found to deteriorate by 0.27 (27%) after less than 1000 hours, provided that the initial efficiency was regarded as 1. In contrast, the element of Example 1 showed a degradation rate of less than 10% even after 1000 hours. FIG. 13 shows a result of the light-resistance test. As evident from FIG. 13, the element of Comparative example 1 showed a degradation rate of 88% after 500 hours, and hence the degradation rate is found to be far inferior to that of Example 3 (about 10%).

Example 4 and Comparative Example 2

The procedure of Example 1 was repeated except that only the AZO layer was not formed (Example 4) or that only the barrier layer was not formed (Comparative example 2). The obtained elements were subjected to the heat-resistance test. As shown in Table 2, the conversion efficiency of the element according to Comparative example 2 was found to be seriously lowered in the test. From the results, it was found that, if the AZO layer is not formed, damages caused in formation of the barrier layer tend to be accumulated to impair the durability. However, it was also found that, even if the AZO layer is singly inserted to the element not comprising the barrier layer, the durability deteriorates very much (degradation rate after 24 hours: 95%).

TABLE 2

Heat resistance test

|  | AZO layer | barrier layer | degradation rate |
| --- | --- | --- | --- |
| Example 4 | not provided | provided | after 1000 hours 87% |
| Comparative example 2 | provided | not provided | after 24 hours 95% |

Example 5

The procedure of Example 1 was repeated except for changing the thickness of the AZO layer. The produced element was subjected to the heat-resistance test. The conversion efficiencies after 528 hours were shown in FIG. 4 in terms of relative values, and those at 25 nm and 0 nm were cited from the data of the elements according to Examples 1 and 4, respectively. As shown in FIG. 4, if the AZO layer has a thickness of 20 to 50 nm, the element has such excellent durability that the degradation rate is 10% or less.

Example 6

Figure 15:
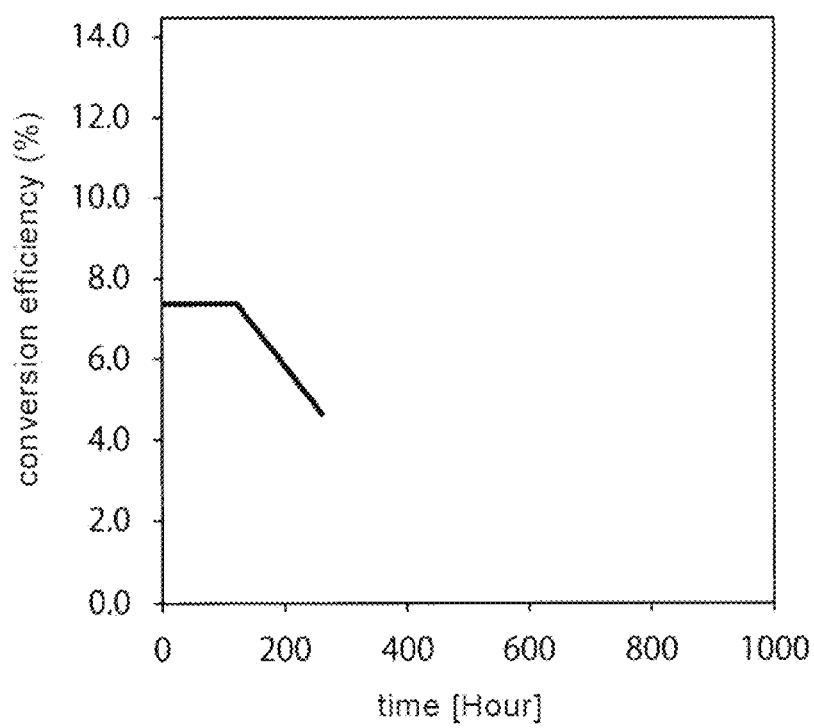
FIG. 15 shows light-resistance of the element according to Example 6.

The procedure of Example 1 was repeated except for changing the thickness of the ITO layer. The produced element was subjected to the heat-resistance test. FIG. 15 shows the date of the element having a 300 nm-thick ITO layer. As shown in FIG. 5, the conversion efficiency was kept higher for 200 hours than that in Comparative example 1.

Example 7

Figure 16:
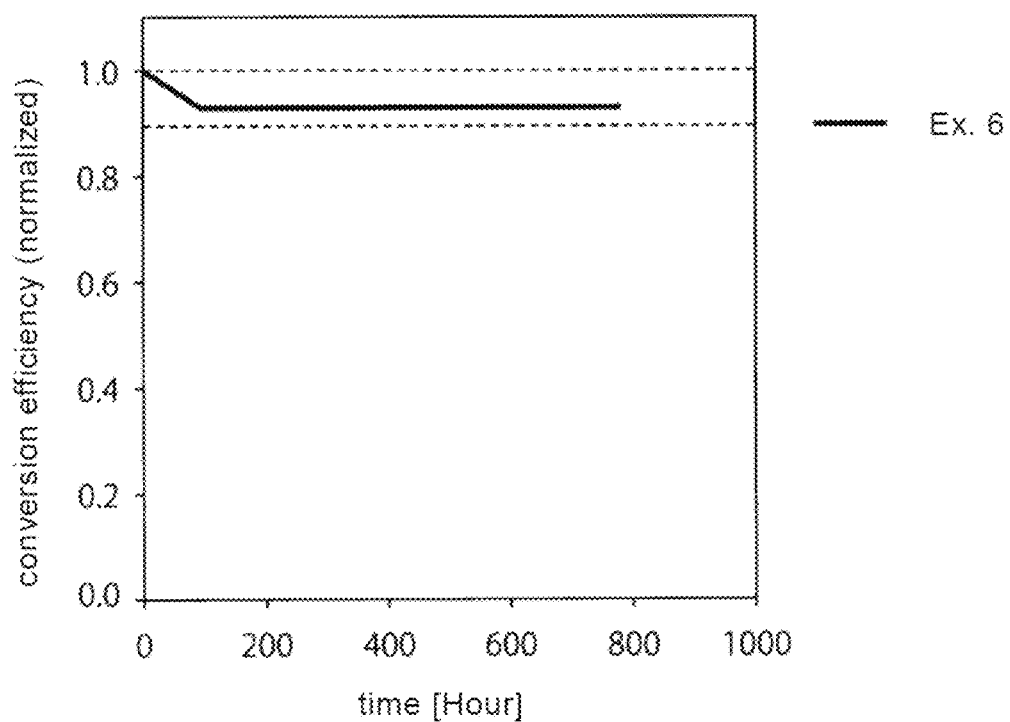
FIG. 16 shows heat-resistance of the element according to Example 7.

The procedure of Example 1 was repeated except for changing the AZO layer into a niobium-doped $TiO_x$ layer. Specifically, niobium-doped $TiO_x$ nanoparticles were applied by spin-coating and then annealed at 75° C. The produced element was subjected to the heat-resistance test. As shown in FIG. 16, the degradation rate was found to be 10% or less even after 1000 hours. That result indicates that a niobium-doped $TiO_x$ (titanium oxide) layer can be adopted as the second buffer layer.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and sprit of the invention.

The invention claimed is:

1. A method for manufacturing a semiconductor element comprising:
    a first transparent electrode,
    an active layer having a perovskite structure comprising halogen ion,
    a second transparent electrode comprising a homogeneous metal layer, and
    a barrier layer which consists of transparent metal oxide and which is provided between said active layer and said second transparent electrode, said barrier layer structurally separating said active layer from said second transparent electrode, and
    said first transparent electrode is made of metal oxide, and said barrier layer has lower crystallinity than said first transparent electrode;
    wherein said barrier layer is formed by sputtering under an atmosphere containing a reactive gas in a concentration of less than 0.5%, and
    wherein said barrier layer has an oxygen content of 62.1 to 62.3 atom %.

2. The method according to claim 1, wherein said sputtering is conducted with an input power of 1200 kW or less.

3. The method according to claim 1, wherein said semiconductor element further comprises an undercoat layer comprising a low molecular weight compound defined as a compound whose number- and weight-average molecular weights (Mn and Mw) are the same and 10,000 or less.

4. A method for manufacturing a semiconductor element comprising:
    a first electrode,
    an active layer having a perovskite structure comprising halogen ion, a second electrode comprising a homogeneous metal layer, and a barrier layer which consists of transparent metal oxide and which is provided between said active layer and said second electrode, said barrier layer structurally separating said active layer from said second electrode, and said first electrode is made of metal oxide, and said barrier layer has lower crystallinity than said first electrode;

wherein said barrier layer is formed by sputtering under an atmosphere containing a reactive gas in a concentration of less than 0.5%, and wherein said barrier layer has an oxygen content of 62.1 to 62.3 atom %.

* * * * *